(12) United States Patent
Worledge et al.

(10) Patent No.: US 11,557,628 B2
(45) Date of Patent: ***Jan. 17, 2023

(54) MULTILAYERED MAGNETIC FREE LAYER STRUCTURE CONTAINING AN ORDERED MAGNETIC ALLOY FIRST MAGNETIC FREE LAYER FOR SPIN-TRANSFER TORQUE (STT) MRAM

(71) Applicant: International Business Machines Corporation, Armonk, NY (US)

(72) Inventors: Daniel Worledge, San Jose, CA (US); Guohan Hu, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 151 days.

This patent is subject to a terminal disclaimer.

(21) Appl. No.: 17/135,219

(22) Filed: Dec. 28, 2020

(65) Prior Publication Data

US 2021/0118949 A1 Apr. 22, 2021

Related U.S. Application Data

(63) Continuation of application No. 16/266,232, filed on Feb. 4, 2019, now Pat. No. 10,916,581.

(51) Int. Cl.
*H01L 27/22* (2006.01)
*H01L 43/08* (2006.01)
(Continued)

(52) U.S. Cl.
CPC ............ *H01L 27/222* (2013.01); *H01L 43/08* (2013.01); *H01L 43/10* (2013.01); *H01L 43/12* (2013.01)

(58) Field of Classification Search
None
See application file for complete search history.

(56) References Cited

U.S. PATENT DOCUMENTS

| 8,059,374 B2 | 11/2011 | Zhao et al. |
| 9,129,635 B2 | 9/2015 | Fukuda et al. |
| | (Continued) | |

FOREIGN PATENT DOCUMENTS

EP 1450177 A2 8/2004

OTHER PUBLICATIONS

Hiratsuka, T., et al., "Fabrication of perpendicularly magnetized magnetic tunnel junctions with L10-CoPt/Co2MnSi hybrid electrode", Journal of Applied Physics, published online May 6, 2010, p. 09C714-1 to 09C714-3, American Institute of Physics, 107.

(Continued)

*Primary Examiner* — Sarah K Salerno
(74) *Attorney, Agent, or Firm* — Scully, Scott, Murphy & Presser, P.C.; Daniel P. Morris, Esq.

(57) ABSTRACT

A multilayered magnetic free layer structure is provided that includes a first magnetic free layer and a second magnetic free layer separated by a non-magnetic layer in which the first magnetic free layer is composed of an ordered magnetic alloy. The ordered magnetic alloy provides a first magnetic free layer that has low moment, but is strongly magnetic. The use of such an ordered magnetic alloy first magnetic free layer in a multilayered magnetic free layer structure substantially reduces the switching current needed to reorient the magnetization of the two magnetic free layers.

20 Claims, 1 Drawing Sheet

(51) Int. Cl.
*H01L 43/10* (2006.01)
*H01L 43/12* (2006.01)

(56) References Cited

U.S. PATENT DOCUMENTS

| | | |
|---|---|---|
| 9,715,915 B2 | 7/2017 | Kita et al. |
| 2015/0129993 A1 | 5/2015 | Tang et al. |
| 2016/0133831 A1 | 5/2016 | Kim et al. |
| 2016/0217842 A1 | 7/2016 | Jeong et al. |
| 2018/0069173 A1 | 3/2018 | Sonobe et al. |

OTHER PUBLICATIONS

Sun, J. Z., "Spin-current interaction with a monodomain magnetic body", Physical Review B, Jul. 1, 2000, pp. 570-578, vol. 62, No. 1.

List of IBM Patents or Patent Applications Treated as Related dated Dec. 28, 2020, 2 pages.

MULTILAYERED MAGNETIC FREE LAYER STRUCTURE CONTAINING AN ORDERED MAGNETIC ALLOY FIRST MAGNETIC FREE LAYER FOR SPIN-TRANSFER TORQUE (STT) MRAM

BACKGROUND

The present application relates to magnetoresistive random access memory (MRAM). More particularly, the present application relates to a magnetic tunnel junction (MTJ) pillar including a multilayered magnetic free layer structure that improves the performance of spin-transfer torque (STT) MRAM.

MRAM is a non-volatile random access memory technology in which data is stored by magnetic storage elements. These elements are typically formed from two ferromagnetic plates, each of which can hold a magnetization, separated by a thin dielectric layer (i.e., a tunnel barrier). One of the two plates (i.e., the magnetic reference or pinned layer) is a permanent magnet set to a particular polarity; the other plate's (i.e., the magnetic free layer's) magnetization can be changed to store information. Such elements may be referred to as a magnetic tunnel junction (MTJ) pillar.

One type of MRAM that can use such a MTJ pillar is STT MRAM. STT MRAM has the advantages of lower power consumption and better scalability over conventional magnetoresistive random access memory which uses magnetic fields to flip the active elements. In STT MRAM, spin-transfer torque is used to flip (switch) the orientation of the magnetic free layer. Moreover, spin-transfer torque technology has the potential to make possible MRAM devices combining low current requirements and reduced cost; however, the amount of current needed to reorient (i.e., switch) the magnetization is at present too high for most commercial applications.

In the prior art of spin torque switching, the emphasis has been on lowering the magnetic damping (also called Gilbert damping) of the magnetic free layer. The theory suggests that the switching current is directly proportional to the damping; see, for example, J. Z. Sun, Phys. Rev. B 62, 570 (2000). Hence, lower damping makes the free layer switch in lower current, which is desirable since it means a smaller cell transistor can be used.

In the prior art of spin torque switching, the emphasis has also been to increase the perpendicular magnetic anisotropy field, $H_k$, of the magnetic material of each magnetic free layer in order to allow the reduction of the moment of the free layer to enable fast switching while maintaining high activation energy, which provides good data retention. In the single domain model, the activation energy, Eb, is proportional to the product of the anisotropy field and the free layer magnetic moment, m, as in $Eb = \frac{1}{2} mH_k$. Reducing m reduces the number of spins in the free layer and therefore, due to conservation of angular momentum, reduces the time required to switch. Therefore, in order to maintain the required Eb, the prior art requires increasing $H_k$. The magnetic anisotropy field, $H_k$, is the in-plane field required to saturate a perpendicularly magnetized layer in the in-plane direction.

FIG. 1 illustrates a prior art MTJ pillar that has been developed in order to reduce the current needed to reorient (i.e., switch) the magnetization of the active elements. The prior art MTJ pillar of FIG. 1 includes a multilayered magnetic free layer structure 14 that contains two magnetic free layers (16 and 20) separated by a non-magnetic layer 18. The prior art MTJ pillar of FIG. 1 also includes a magnetic reference (or pinned) layer 10, and a tunnel barrier layer 12. Element 16 is the first magnetic free layer that forms an interface with the tunnel barrier layer 12, while element 20 is the second magnetic free layer that is separated from the first magnetic free layer 16 by the non-magnetic layer 18. In the drawing, the arrow within the magnetic reference layer 10 shows a possible orientation of that layer and the double headed arrows in the first and second magnetic free layers (16 and 20) illustrate that the orientation in those layers can be switched. The non-magnetic layer 18 is thin enough that the two magnetic free layers (16 and 20) are coupled together magnetically, so that in equilibrium the first and second magnetic free layers 16 and 20 are always parallel.

One drawback of the prior art MTJ pillar shown in FIG. 1 is that the switching of the multilayered magnetic free layer structure 14 can be too slow in comparison to the length of the applied voltage pulse. This 'drag' in switching of the orientation of the multilayered magnetic free layer structure 14 of the prior art MTJ pillar of FIG. 1 may result in a write error.

There is thus a need for providing MTJ pillars for use in STT MRAM technology which include an improved multilayered magnetic free layer structure that substantially reduces the switching current needed to reorient the magnetization of the multilayered magnetic free layer structure, while improving the switching speed and even reducing write errors of the STT MRAM.

SUMMARY

A multilayered magnetic free layer structure is provided that includes a first magnetic free layer and a second magnetic free layer separated by a non-magnetic layer in which the first magnetic free layer is composed of an ordered magnetic alloy. The ordered magnetic alloy provides a first magnetic free layer that has low moment (on order of 100 to 500 emu/cm$^3$), but is strongly magnetic (i.e., has a magnetic Curie temperature, Tc, on the order of 200° C. or greater). The use of such an ordered magnetic alloy first magnetic free layer in a multilayered magnetic free layer structure substantially reduces the switching current needed to reorient the magnetization of the two magnetic free layers.

In one aspect of the present application, a magnetic tunnel junction (MTJ) pillar is provided. In one embodiment, the MTJ pillar includes a multilayered magnetic free layer structure including a first magnetic free layer and a second magnetic free layer separated by a non-magnetic layer. In accordance with the present application, the first magnetic free layer is composed of an ordered magnetic alloy.

In another aspect of the present application, a spin-transfer torque magnetic random access memory (STT MRAM) is provided. In one embodiment, the STT MRAM includes a magnetic tunnel junction pillar that is located between a bottom electrode and a top electrode. The magnetic tunnel junction pillar includes a multilayered magnetic free layer structure including a first magnetic free layer and a second magnetic free layer separated by a non-magnetic layer. In accordance with the present application, the first magnetic free layer is composed of an ordered magnetic alloy.

In yet another aspect of the present application, a method of improving the performance of a spin-transfer torque magnetic random access memory (STT MRAM) is provided. In one embodiment, the method includes providing a multilayered magnetic free layer structure on a surface of a tunnel barrier layer that is located on a magnetic reference layer. The multilayered magnetic free layer structure includes a first magnetic free layer and a second magnetic free layer separated by a non-magnetic layer. In accordance with the present application, the first magnetic free layer is composed of an ordered magnetic alloy.

DETAILED DESCRIPTION

Figure 1:
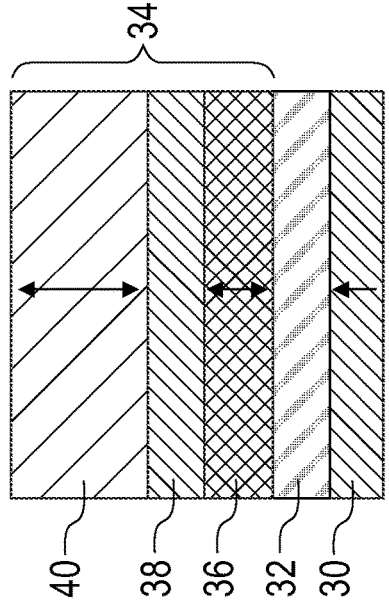
FIG. 1 is a cross sectional view of a prior art MTJ pillar including a multilayered magnetic free layer structure which includes two magnetic free layers separated by a non-magnetic layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 2:
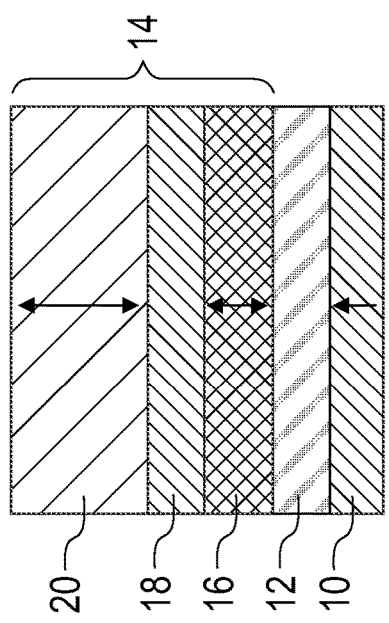
FIG. 2 is a cross sectional view of an exemplary MTJ pillar in accordance with one embodiment of the present application.

Referring first to FIG. 2, there is illustrated an exemplary MTJ pillar in accordance with one embodiment of the present application. The term "pillar" as used in the present application denotes a multilayered structure that has been formed by deposition and photolithography. The MTJ pillar of FIG. 2 includes a magnetic reference layer 30, a tunnel barrier layer 32, and a multilayered magnetic free layer structure 34 that includes a first magnetic free layer 36, a non-magnetic layer 38, and a second magnetic free layer 40. The MTJ pillar of FIG. 2 is typically present on a bottom electrode (not shown) that is located on a surface of an electrically conductive structure (not shown) that is embedded in an interconnect dielectric material layer (also not shown). A MTJ cap and a top electrode (both not shown) can be formed above a topmost surface of the second magnetic free layer 40. The MTJ pillar of FIG. 2, together with the MTJ cap and top electrode can be embedded within a second interconnect dielectric material layer.

The bottom electrode may be composed of an electrically conductive material and can be formed utilizing techniques well known to those skilled in the art. The bottom electrode may be formed on a recessed surface or a non-recessed surface of the electrically conductive structure that is embedded in the first interconnect dielectric material layer.

The magnetic reference layer 30 has a fixed magnetization and it is typically formed upon on the bottom electrode (not shown). The magnetic reference layer 30 may be composed of a metal or metal alloy that includes one or more metals exhibiting high spin polarization. In alternative embodiments, exemplary metals for the formation of magnetic reference layer 30 include iron, nickel, cobalt, chromium, boron, and manganese. Exemplary metal alloys may include the metals exemplified by the above. In another embodiment, the magnetic reference layer 30 may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed, and some layers within 30 may be coupled antiparallel to each other in order to reduce the dipole fringing field on the free layer. The thickness of magnetic reference layer 30 will depend on the material selected. In one example, magnetic reference layer 30 may have a thickness from 0.3 nm to 3 nm. The magnetic reference layer 30 can be formed by utilizing a deposition process such as, for example, chemical vapor deposition (CVD), plasma enhanced chemical vapor deposition (PECVD), physical vapor deposition (PVD), or sputtering.

Tunnel barrier layer 32, which is formed on the magnetic reference layer 30, is composed of an insulator material and is formed at such a thickness as to provide an appropriate tunneling resistance. Exemplary materials for the tunnel barrier layer 32 include magnesium oxide, aluminum oxide, and titanium oxide, or their combinations, or materials of higher electrical tunnel conductance, such as semiconductors or low-bandgap insulators. The thickness of the tunnel barrier layer 32 will depend on the material selected. In one example, the tunnel barrier layer 32 may have a thickness from 0.5 nm to 1.5 nm. The tunnel barrier layer 32 can be formed by utilizing a deposition process such as, for example, CVD, PECVD, PVD, or sputtering.

The first magnetic free layer 36 of the multilayered magnetic free layer structure 34 of the present application, which is formed on the tunnel barrier layer 32, is composed of an ordered magnetic alloy with a magnetization that can be changed in orientation relative to the magnetization orientation of the magnetic reference layer 30. As mentioned above, the ordered magnetic alloy that provides the first magnetic free layer 36 has a low moment (on order of on order of 100 to 500 emu/cm$^3$), but is strongly magnetic (i.e., has a magnetic Curie temperature, Tc, on the order of 200° C. or greater). By "ordered magnetic alloy" it is meant a magnetic alloy that has a lattice structure in which atoms of one element occupy particular sites and atoms of at least one other element occupy other sites.

In one embodiment, the ordered magnetic alloy is a Heusler alloy. The term "Heusler alloy" is used herein to denote an intermetallic ternary compound of the formula $X_2YX$, which possesses the Heusler of half-Heusler crystal structure. Exemplary Heusler alloys that can be used in the present application include, but are not limited to, $Mn_3Ge$, $Mn_3Ga$, $Co_2MnSi$, $Mn_3Sn$ or $Mn_3Sb$.

In another embodiment, the ordered magnetic alloy is a L10 alloy. The term "L10 alloy" denotes an intermetallic compound with a body centered tetragonal crystal structure wherein one element occupies the corners of the lattice cell and the other element occupies the body center. Exemplary L10 alloys that can be used in the present application include, but are not limited to, MnAl or CoFe.

The first magnetic free layer 36 can be formed by utilizing a deposition process such as, for example, CVD, PECVD, PVD, or sputtering. The first magnetic free layer 36 has a first perpendicular magnetic anisotropy field which can be from 2 kOe to 20 kOe. The first magnetic free layer 36 has a first thickness. In one embodiment, the first thickness of the first magnetic free layer 36 is from 0.8 nm to 3 nm.

The non-magnetic layer 38 of the multilayered magnetic free layer structure 34 is composed of a non-magnetic material that contains at least one element with an atomic number less than 74 such as, for example, beryllium (Be), magnesium (Mg), aluminum (Al), calcium (Ca), boron (B), carbon (C), silicon (Si), vanadium (V), chromium (Cr), titanium (Ti), manganese (Mn) or any combination including alloys thereof. The thickness of the non-magnetic layer 34 is thin enough to allow the first and second magnetic free layers (36, 40) to couple together magnetically so that in equilibrium layers 36 and 40 are always parallel. In one example, the non-magnetic layer 38 has a thickness from 0.3 nm to 3.0 nm. The non-magnetic layer 38 can be formed by utilizing a deposition process such as, for example, CVD, PECVD, PVD, or sputtering.

The second magnetic free layer 40 of the multilayered magnetic free layer structure 34 is formed on the non-magnetic material layer 38. The second magnetic free layer 40 may include a magnetic material or a stacked of magnetic materials with a magnetization that can also be changed in orientation relative to the magnetization orientation of the magnetic reference layer 30. Exemplary materials for the second magnetic free layer 40 include alloys and/or multi-layers of cobalt, iron, alloys of cobalt-iron, nickel, alloys of nickel-iron, and alloys of cobalt-iron-boron. The second magnetic free layer 40 can be formed by utilizing a deposition process such as, for example, CVD, PECVD, PVD, or sputtering.

The second magnetic free layer 40 has a second perpendicular magnetic anisotropy field which can be from 1 kOe to 5 kOe. The second magnetic free layer 40 has a second thickness which is typically, but not necessarily always, greater than the first thickness of the first magnetic free layer 36. In one embodiment, the second thickness of the second magnetic free layer 40 is from 1.5 nm to 4 nm.

In some embodiments (not shown), a MTJ cap layer can be formed on a physically exposed surface of the second magnetic free layer 40. When present, the MTJ cap may be composed of Nb, NbN, W, WN, Ta, TaN, Ti, TiN, Ru, Mo, Cr, V, Pd, Pt, Rh, Sc, Al or other high melting point metals or conductive metal nitrides. The MTJ cap layer may be formed utilizing a deposition process including, for example, CVD, PECVD, ALD, PVD, sputtering, chemical solution deposition or plating. The MTJ cap layer may have a thickness from 2 nm to 25 nm; other thicknesses are possible and can be used in the present application as the thickness of the MTJ cap layer.

The top electrode, which is formed above the second magnetic free layer 40, includes an electrically conductive material. In one embodiment, the top electrode is composed of a same electrically conductive material as the bottom electrode. In another embodiment, the top electrode may be composed of a compositionally different electrically conductive material than the bottom electrode. The top electrode may be formed utilizing a deposition process. The top electrode is typically formed within an opening that is provided to an interconnect dielectric material layer that is formed laterally adjacent and atop the MTJ pillar of FIG. 2.

Figure 3:
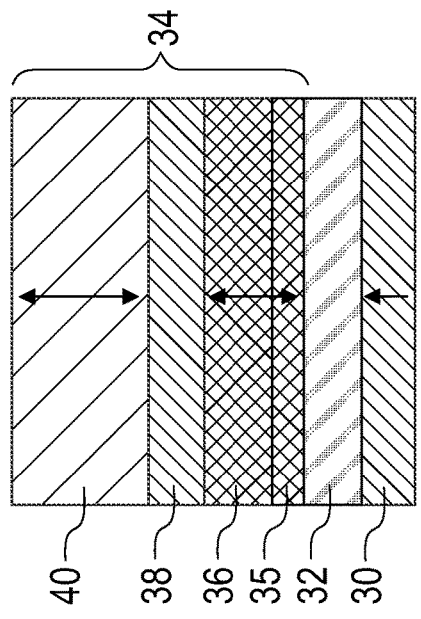
FIG. 3 is a cross sectional view of an exemplary MTJ pillar in accordance with another embodiment of the present application.

Referring now to FIG. 3, there is illustrated an exemplary MTJ pillar in accordance with another embodiment of the present application. The MTJ pillar of FIG. 3 is similar to the MTJ pillar shown in FIG. 2 except that the MTJ pillar of FIG. 3 includes an interfacial first magnetic free layer 35 located between the tunnel barrier 32 and the first magnetic free layer 36 that is composed of the ordered magnetic alloy. Notably, the MTJ pillar of FIG. 3 includes magnetic reference layer 30, tunnel barrier layer 32, and a multilayered magnetic free layer structure 34 that includes the interfacial first magnetic free layer 35, first magnetic free layer 36, non-magnetic layer 38, and second magnetic free layer 40.

The MTJ pillar of FIG. 3 is typically present on a bottom electrode (not shown) that is located on a surface of an electrically conductive structure (not shown) that is embedded in an interconnect dielectric material layer (also not shown). A MTJ cap and a top electrode (both not shown) can be formed above a topmost surface of the second magnetic free layer 40. The MTJ pillar of FIG. 3, together with the MTJ cap and top electrode can be embedded within a second interconnect dielectric material layer.

In the embodiment illustrated in FIG. 3, the bottom electrode, the magnetic reference layer 30, the tunnel barrier layer 32, the first magnetic free layer 36, the non-magnetic layer 38, the second magnetic free layer 40, the MTJ cap, and the top electrode are the same as mentioned above for the exemplary structure shown in FIG. 2.

The interfacial first magnetic free layer 35 is composed of a CoFe alloy. The amount of Co and Fe present in the CoFe alloy may vary. Typically, the CoFe alloy contains from greater than 0 atomic percent to 50 atomic percent Co, and from 50 atomic percent to less than 100 atomic percent Fe. The CoFe alloy can be formed by utilizing a deposition process such as, for example, CVD, PECVD, PVD, or sputtering. In one embodiment, the interfacial first magnetic free layer 35 may have a thickness from 0.2 nm to 1 nm. The interfacial first magnetic free layer 35 is used in order to maintain high magnetoresistance in the MTJ pillar.

The multilayered magnetic free layer structure 34 of the present application shown in either FIG. 2 or FIG. 3 requires a substantially reduced switching current needed to reorient the magnetization of the magnetic free layers (36, 40). Notably, the use of the ordered magnetic alloy as the first magnetic free layer 36 improves the switching speed of the magnetic free layers and thus reduces, and even eliminates, write errors.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A magnetic tunnel junction pillar comprising:
    a multilayered magnetic free layer structure comprising a first magnetic free layer and a second magnetic free layer separated by a non-magnetic layer, wherein the first magnetic free layer has a magnetic moment from 100 emu/cm$^3$ to 500 emu/cm$^3$ and a perpendicular magnetic anisotropy from 2 kOe to 20 kOe and is composed of ordered magnetic alloy, and the second magnetic free layer has a perpendicular magnetic anisotropy from 1 kOe to 5 kOe and is composed of at least one magnetic material that differs from the ordered magnetic alloy;
    a tunnel barrier layer located on a surface of the first magnetic free layer opposite a surface of the first magnetic free layer that forms an interface with the non-magnetic layer; and
    a magnetic reference layer located on a surface of the tunnel barrier layer that is opposite the surface of the tunnel barrier that is located on the first magnetic free layer.

2. The magnetic tunnel junction pillar of claim 1, wherein the ordered magnetic alloy is a Heusler alloy.

3. The magnetic tunnel junction pillar of claim 2, wherein the Heusler alloy comprises Mn$_3$Ge, Mn$_3$Ga, Co$_2$MnSi, Mn$_3$Sn or Mn$_3$Sb.

4. The magnetic tunnel junction pillar of claim 1, wherein the ordered magnetic alloy is a L10 alloy.

5. The magnetic tunnel junction pillar of claim 4, wherein the L10 alloy comprises MnAl or CoFe.

6. The magnetic tunnel junction pillar of claim 1, further comprising an interfacial first magnetic free layer composed of CoFe alloy located between the first magnetic free layer and the tunnel barrier layer.

7. The magnetic tunnel junction pillar of claim 1, wherein the non-magnetic layer is composed of a non-magnetic material that contains at least one element with an atomic number less than 74.

8. The magnetic tunnel junction pillar of claim 1, wherein the non-magnetic layer has a thickness that allows the first and second magnetic free layers to couple together magnetically so that in equilibrium the first and second magnetic free layers are always parallel.

9. A memory device comprising:
    a magnetic tunnel junction pillar located between a bottom electrode and a top electrode, the magnetic tunnel junction pillar comprising a multilayered magnetic free layer structure comprising a first magnetic free layer and a second magnetic free layer separated by a non-magnetic layer, wherein the first magnetic free layer has a magnetic moment from 100 emu/cm$^3$ to 500 emu/cm$^3$ and a perpendicular magnetic anisotropy from 2 kOe to 20 kOe and is composed of ordered magnetic alloy, and the second magnetic free layer has a perpendicular magnetic anisotropy from 1 kOe to 5 kOe and is composed of at least one magnetic material that differs from the ordered magnetic alloy, a tunnel barrier layer located on a surface of the first magnetic free layer opposite a surface of the first magnetic free layer that forms an interface with the non-magnetic layer, and a magnetic reference layer located on a surface of the tunnel barrier layer that is opposite the surface of the tunnel barrier that is located on the first magnetic free layer.

10. The memory device of claim 9, wherein the ordered magnetic alloy is a Heusler alloy.

11. The memory device of claim 10, wherein the Heusler alloy comprises Mn$_3$Ge, Mn$_3$Ga, Co$_2$MnSi, Mn$_3$Sn or Mn$_3$Sb.

12. The memory device of claim 9, wherein the ordered magnetic alloy is a L10 alloy.

13. The memory device of claim 12, wherein the L10 alloy comprises MnAl or CoFe.

14. The memory device of claim 9, further comprising an interfacial first magnetic free layer composed of CoFe alloy located between the first magnetic free layer and the tunnel barrier layer.

15. The memory device of claim 9, wherein the non-magnetic layer is composed of a non-magnetic material that contains at least one element with an atomic number less than 74.

16. The memory device of claim 9, wherein the non-magnetic layer has a thickness that allows the first and second magnetic free layers to couple together magnetically so that in equilibrium the first and second magnetic free layers are always parallel.

17. The memory device of claim 9, wherein the memory device is a spin-transfer torque magnetic random access memory.

18. A method of improving the performance of spin-transfer torque magnetic random access memory, the method comprising:
    providing a multilayered magnetic free layer structure on a surface of a tunnel barrier layer that is located on a magnetic reference layer, wherein the multilayered magnetic free layer structure comprises a first magnetic free layer and a second magnetic free layer separated by a non-magnetic layer, wherein the first magnetic free layer is located on the tunnel barrier layer and has a magnetic moment from 100 emu/cm$^3$ to 500 emu/cm$^3$ and a perpendicular magnetic anisotropy from 2 kOe to 20 kOe and is composed of ordered magnetic alloy, and the second magnetic has a perpendicular magnetic anisotropy from 1 kOe to 5 kOe and is composed of at least one magnetic material that differs from the ordered magnetic alloy.

19. The method of claim 18, wherein the ordered magnetic alloy is a Heusler alloy or a L10 alloy.

20. The method of claim 18, further comprising forming an interfacial first magnetic free layer composed of CoFe alloy between the first magnetic free layer and the tunnel barrier layer.

* * * * *